United States Patent
Kato et al.

(10) Patent No.: US 8,853,097 B2
(45) Date of Patent: Oct. 7, 2014

(54) PARTICLE REDUCING METHOD

(71) Applicant: Tokyo Electron Limited, Tokyo (JP)

(72) Inventors: Hitoshi Kato, Iwate (JP); Hiroyuki Kikuchi, Iwate (JP); Takeshi Kumagai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 12 days.

(21) Appl. No.: 13/743,508

(22) Filed: Jan. 17, 2013

(65) Prior Publication Data
US 2013/0189849 A1 Jul. 25, 2013

(30) Foreign Application Priority Data
Jan. 20, 2012 (JP) .................. 2012-010162

(51) Int. Cl.
*H01L 21/02* (2006.01)
*C23C 16/44* (2006.01)
*C23C 16/455* (2006.01)

(52) U.S. Cl.
CPC ........ *H01L 21/0206* (2013.01); *C23C 16/4405* (2013.01); *C23C 16/45551* (2013.01); *C23C 16/4554* (2013.01)
USPC .......................................... 438/758

(58) Field of Classification Search
None
See application file for complete search history.

(56) References Cited

U.S. PATENT DOCUMENTS

| | | | |
|---|---|---|---|
| 2007/0017636 A1* | 1/2007 | Goto et al. | 156/345.47 |
| 2007/0218702 A1* | 9/2007 | Shimizu et al. | 438/758 |
| 2012/0052693 A1* | 3/2012 | Ozaki et al. | 438/771 |

FOREIGN PATENT DOCUMENTS

| | | |
|---|---|---|
| JP | 2008-159787 | 7/2008 |
| JP | 4661990 | 3/2011 |

* cited by examiner

*Primary Examiner* — Seahvosh Nikmanesh
(74) *Attorney, Agent, or Firm* — IPUSA, PLLC

(57) ABSTRACT

A particle reducing method includes a step of supplying a first gas to a vacuum chamber in which a susceptor, formed by an insulating object and the surface of which is provided with a substrate mounting portion, is rotatably provided; a step of generating plasma from the first gas by supplying high frequency waves to a plasma generating device provided for the vacuum chamber; and a step of exposing the substrate mounting portion, on which a substrate is not mounted, to the plasma while rotating the susceptor.

8 Claims, 11 Drawing Sheets

PARTICLE REDUCING METHOD

CROSS-REFERENCE TO RELATED APPLICATION

The present application is based on Japanese Priority Application No. 2012-010162 filed on Jan. 20, 2012, the entire contents of which are hereby incorporated herein by reference.

BACKGROUND OF THE INVENTION

1. Field of the Invention The present invention relates to a particle reducing method and a film deposition method.

2. Description of the Related Art

A film deposition method in which a thin film is formed on a semiconductor wafer (hereinafter, referred to as a "wafer") is known as one of methods of manufacturing a semiconductor integrated circuit. A film deposition apparatus which is used for the film deposition method includes a sealable chamber, a susceptor provided in the chamber on which a wafer is to be mounted, a source gas supplying unit which supplies a source gas onto the wafer mounted on the susceptor, and an evacuation device which is connected to the chamber and evacuates the source gas.

When forming a thin film on a wafer using such a film deposition apparatus, there is a problem that a deposited object is also formed inside the chamber to cause particles when the deposited object is peeled. In order to solve this problem, a method of removing the deposited object inside the chamber has been examined (see Patent Document 1, for example).

Here, in accordance with the miniaturization of the circuit components formed on the wafer, it is required to further improve the film thickness uniformity and controllability of the film thickness of the thin film. In order to respond to such a requirement, a film deposition method so-called "Atomic Layer Deposition" (ALD) or "Molecular Layer Deposition" (MLD) is expected.

For this film deposition method, a film deposition apparatus as follows may be used. The film deposition apparatus includes a susceptor, on which plural wafers are to be mounted, rotatably provided in a vacuum chamber and, a first reaction gas supplying unit which is capable of supplying a first reaction gas onto the plural wafers which are mounted on the susceptor, and a second reaction gas supplying unit which is provided apart from the first reaction gas supplying unit in a rotational direction of the susceptor and is capable of supplying a second reaction gas which can react with the first reaction gas. With this film deposition apparatus, when the first reaction gas and the second reaction gas are respectively supplied from the first reaction gas supplying unit and the second reaction gas supplying unit while rotating the susceptor, the first reaction gas and the second reaction gas are alternately adsorbed onto the surfaces of the wafers on the susceptor so that thin films, which are a result of the surface reaction, are formed on the wafers, respectively.

Specifically, in an ALD apparatus provided by the inventors of the present invention (see Patent Document 2), the first reaction gas and the second reaction gas can be sufficiently separated from each other so that the deposited object (residue) is hardly deposited inside the vacuum chamber. Therefore, generation of the particles due to the deposited object deposited inside the vacuum chamber can be sufficiently lowered.

However, recently, the requirement to reduce the particles has been increased so that a method of further reducing the particles is required.

[Patent Document]

[Patent Document 1] Japanese Laid-open Patent Publication No. 2008-159787

[Patent Document 2] Japanese Patent No. 4661990

SUMMARY OF THE INVENTION

The present invention is made in light of the above problems, and provides a particle reducing method capable of reducing particles caused by a susceptor on which a substrate is to be mounted.

According to an embodiment, there is provided a particle reducing method including a step of supplying a first gas to a vacuum chamber in which a susceptor, formed by an insulating object and the surface of which is provided with a substrate mounting portion, is rotatably provided; a step of generating plasma from the first gas by supplying high frequency waves to a plasma generating device provided for the vacuum chamber; and a step of exposing the substrate mounting portion, on which a substrate is not mounted, to the plasma while rotating the susceptor.

According to another embodiment, there is provided a film deposition method using a film deposition apparatus including a vacuum chamber in which a susceptor, formed by an insulating object and the surface of which is provided with a substrate mounting portion, including a film deposition process step in which a substrate is mounted on the substrate mounting portion and a film is deposited on the substrate; and a particle reducing process step performed before or after the film deposition process step, in which particles in the vacuum chamber are reduced without mounting the substrate on the substrate mounting portion, the particle reducing process step including, a step of supplying a first gas to the vacuum chamber; a step of generating plasma from the first gas by supplying high frequency waves to a plasma generating device provided for the vacuum chamber; and a step of exposing the substrate mounting portion, on which a substrate is not mounted, to the plasma while rotating the susceptor.

Note that also arbitrary combinations of the above-described constituents, and any exchanges of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
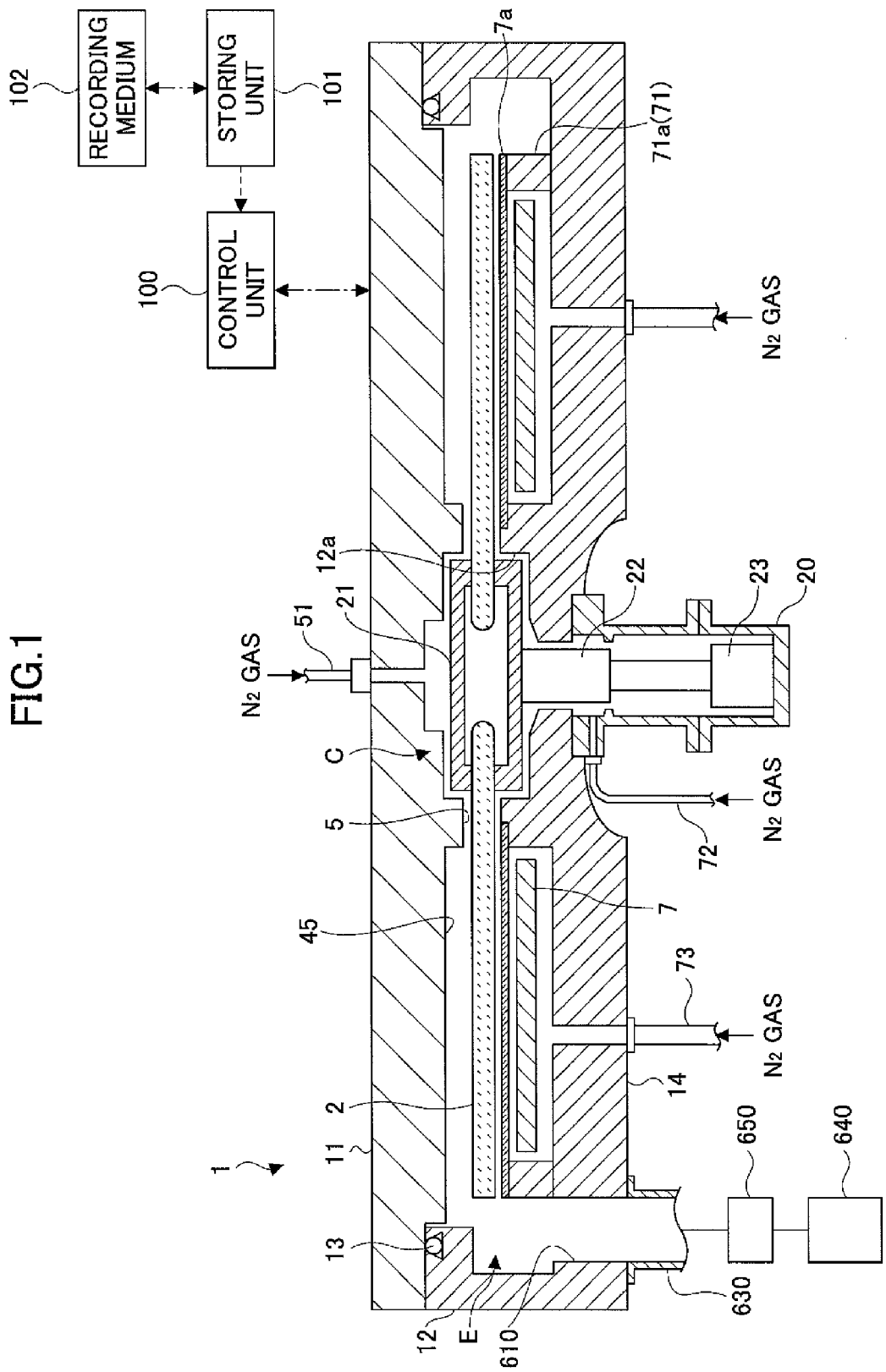
FIG. 1 a cross-sectional view of an example of a film deposition apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated. Further, drawings are not intended to show relative ratios of a component or components.

First, a mechanism in which particles are generated in a substrate processing apparatus (such as the above described ADL apparatus) is explained.

The present inventors have found that the particles may be generated by the following reason(s) after extensive research.

The susceptor included in the above described ALD apparatus may be manufactured by forming a concave portion on which a wafer can be mounted on a circular plate made of quartz, for example. Specifically, a circular plate made of quartz having a size (diameter) large enough for having a predetermined numbers of wafers mounted thereon is prepared. Then, plural concave portions are formed on the surface of the circular plate by grinding, etching or the like. Usually, when a component made of quartz is grinded, etched or the like, the component is treated with anneal at a predetermined temperature in order to flatten the surface or the like. However, when manufacturing the susceptor, annealing may not be performed in order to prevent deformation or the like of the susceptor by the heat. Thus, the bottom surface of the concave portion remains as a rough surface.

Further, each of the concave portions is formed to have a slightly larger diameter, for example, 2 to 4 mm larger, than that of the wafer in order to have the wafer easily mounted therein. Thus, when the susceptor is started to be rotated after the wafers are mounted on the concave portions, respectively, the wafers move within the respective concave portions so that the backside surface of each of the wafers rasps with the bottom surface of the respective concave portion. Here, as the bottom surface of the concave portion is the rough surface while the backside surface of the wafer is polished to be a mirror finished surface, the rough surface of the concave portion is polished to generate particles of quartz.

When such particles of quartz exist at the bottom surface of each of the concave portions, the particles of quartz may be scattered when the wafers are mounted on the concave portions or the wafers are removed from the concave portions, respectively, to cause contamination where the particles of quartz adhere onto the surfaces of the wafers.

Thus, it is necessary to remove such particles of quartz in order to reduce the particles adhere onto the surfaces of the wafers. However, the particles of quartz are generated every time the wafers are mounted on the respective concave portions of the susceptor provided in the vacuum chamber. Thus, it is hard to remove the particles by chemical solution or the like. Further, if the particles of quartz are included in the small rough surface of the concave portion, it is hard to remove the particles by the purging gas or the like.

(Film Deposition Apparatus)

First, a film deposition apparatus for performing a film deposition method of the embodiment is explained.

Figure 2:
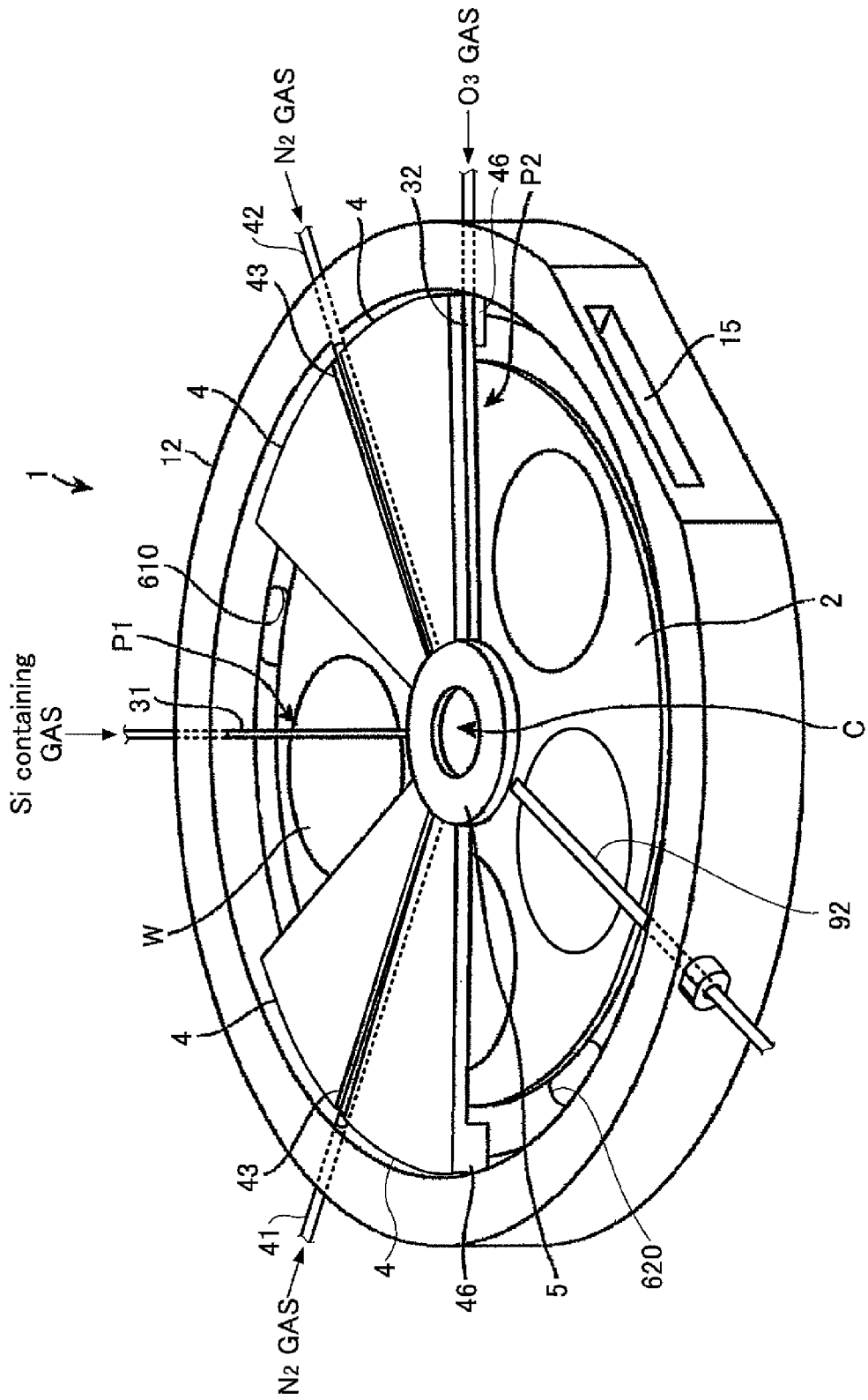
FIG. 2 is a perspective view showing an inside structure of a vacuum chamber of the film deposition apparatus shown in FIG. 1.
Figure 3:
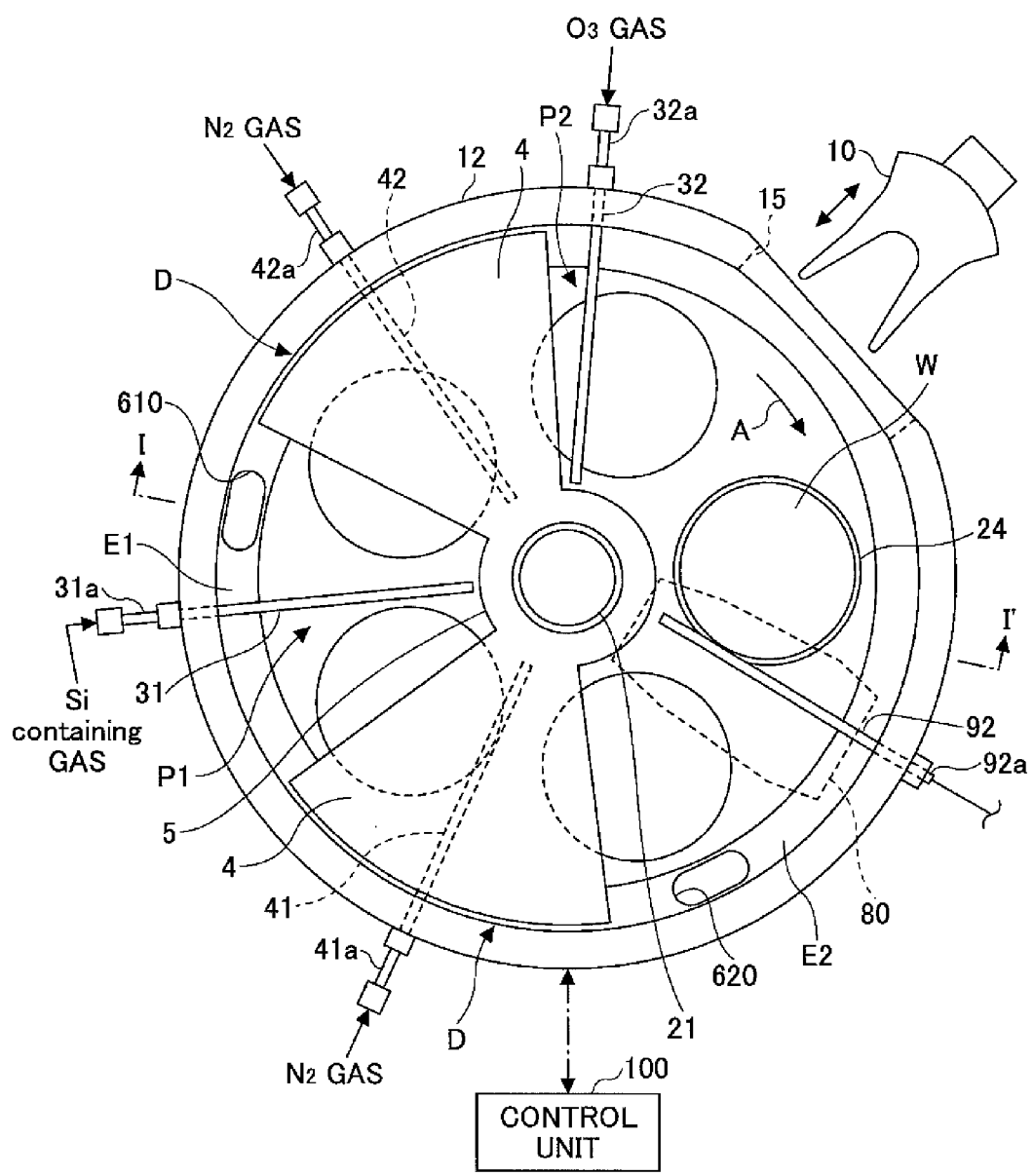
FIG. 3 is a schematic top view showing an example of the vacuum chamber of the film deposition apparatus shown in FIG. 1.

With reference to FIG. 1 to FIG. 3, a film deposition apparatus includes a vacuum chamber 1 having a substantially flat circular shape, and a susceptor 2 provided in the vacuum chamber 1 and has a center of rotation at the center of the vacuum chamber 1. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The susceptor (turntable) 2 is made of quartz, for example. The susceptor 2 is attached to the cylindrical shaped core unit 21 at its center portion. The core unit 21 is fixed to the upper end of the rotary shaft 22 which extends in the vertical direction. The rotary shaft 22 is provided to penetrate the bottom portion 14 of the vacuum chamber 1 and its lower end is attached to the driving unit 23 that rotates the rotary shaft 22 (FIG. 1) around a vertical direction. The rotary shaft 22 and the driving unit 23 are housed in the tubular case body 20 whose upper surface is open. The case body 20 is attached to a lower surface of the bottom portion 14 of the vacuum chamber 1 via a flange portion provided at its upper surface in an airtight manner so that the inner atmosphere of the case body 20 is isolated from the outside atmosphere.

As shown in FIG. 2 and FIG. 3, plural (five in this case) circular concave portions 24 are provided at a front surface of the susceptor 2 along a rotating direction (circumferential direction) shown by an arrow A for holding plural semiconductor wafers (which will be simply referred to as "wafers" hereinafter) W, respectively. Here is an example where the wafer W is shown to be placed in one of the concave portions 24 in FIG. 3 for an explanatory purpose.

Each of the concave portions 24 is formed to have a slightly larger inner diameter, for example, 4 mm larger, than the diameter of the wafer W, and a depth substantially equal to the thickness of the wafer W. Thus, when the wafer W is mounted in the respective concave portion 24, the surface of the wafer W and the surface of the susceptor 2 (where the wafer W is not mounted) become almost the same height.

As will be explained later, each of the concave portions 24 are provided with three, for example, through holes, through which lift pins (neither are shown in the drawings) for supporting a back surface of the respective wafer W and lifting the wafer W penetrate.

FIG. 2 and FIG. 3 are views showing an inside structure of the vacuum chamber 1. The ceiling plate 11 is not shown in FIG. 2 and FIG. 3 so as to simplify explanation.

As shown in FIG. 2 and FIG. 3, a reaction gas nozzle 31, a reaction gas nozzle 32, separation gas nozzles 41 and 42, and a gas introduction nozzle 92, which are made of quartz, for example, are provided above the susceptor 2. For the example shown in FIG. 3, the gas introduction nozzle 92, the separation gas nozzle 41, the reaction gas nozzle 31, the separation gas nozzle 42, and the reaction gas nozzle 32 are aligned in this order from a transfer port 15 (which will be explained later) in a clockwise direction (the rotation direction of the susceptor 2 as shown by an arrow A in FIG. 3) with a space therebetween in a circumferential direction of the vacuum chamber 1. Gas introduction ports 92a, 31a, 32a, 41a, and 42a (FIG. 3) which are base portions of the nozzles 92, 31, 32, 41, and 42, respectively, are fixed to an outer peripheral wall of the fixing chamber body 12 so that these nozzles 92, 31, 32, 41, and 42 are introduced into the vacuum chamber 1 from the outer peripheral wall of the vacuum chamber 1 to extend in a radial direction and parallel to the surface of the susceptor 2.

As simply shown by a dotted line for an explanatory purpose in FIG. 3, a plasma generating device 80 (plasma generating source) is provided above the gas introduction nozzle 92. The plasma generating device 80 is explained later.

In this embodiment, the reaction gas nozzle 31 is connected to a supplying source (not shown in the drawings) of a Si (silicon) containing gas as a first reaction gas via a pipe, a flow controller and the like (not shown in the drawings). The reaction gas nozzle 32 is connected to a supplying source (not shown in the drawings) of an oxidation gas as a second reaction gas via a pipe, a flow controller and the like (not shown in the drawings). The separation gas nozzles 41 and 42 are connected to supplying sources (not shown in the drawings) of nitrogen ($N_2$) gas as a separation gas via pipes and flow controller valves and the like, respectively.

In this embodiment, organo-aminosilane gas is used as the Si containing gas, and $O_3$ (ozone) gas is used as the oxidation gas.

The reaction gas nozzles 31 and 32 are provided with plural gas discharge holes 33 (see FIG. 4) which are facing downward to the susceptor 2 along the longitudinal directions of the reaction gas nozzles 31 and 32 with a 10 mm interval, respectively, for example. An area below the reaction gas nozzle 31 is a first process area P1 in which the Si containing gas is adsorbed onto the wafers W. An area below the reaction gas nozzle 32 is a second process area P2 in which the Si containing gas which is adsorbed onto the wafers W at the first process area P1 is oxidized.

Referring to FIG. 2 and FIG. 3, the ceiling plate 11 is provided with two protruding portions 4. The protruding portions 4 are attached to the backside surface of the ceiling plate 11 to be protruded toward the susceptor 2, as will be explained later, in order to form separation area D with the separation gas nozzles 41 and 42. Each of the protruding portions 4 has substantially a sector top view shape where the apex is removed in an arc shape. For each of the protruding portions 4, the inner arc shaped portion is connected to an inner protruding portion 5 (which will be explained later) and the outer arc shaped portion is formed to extend along an inner peripheral surface of the chamber body 12 of the vacuum chamber 1.

Figure 4:
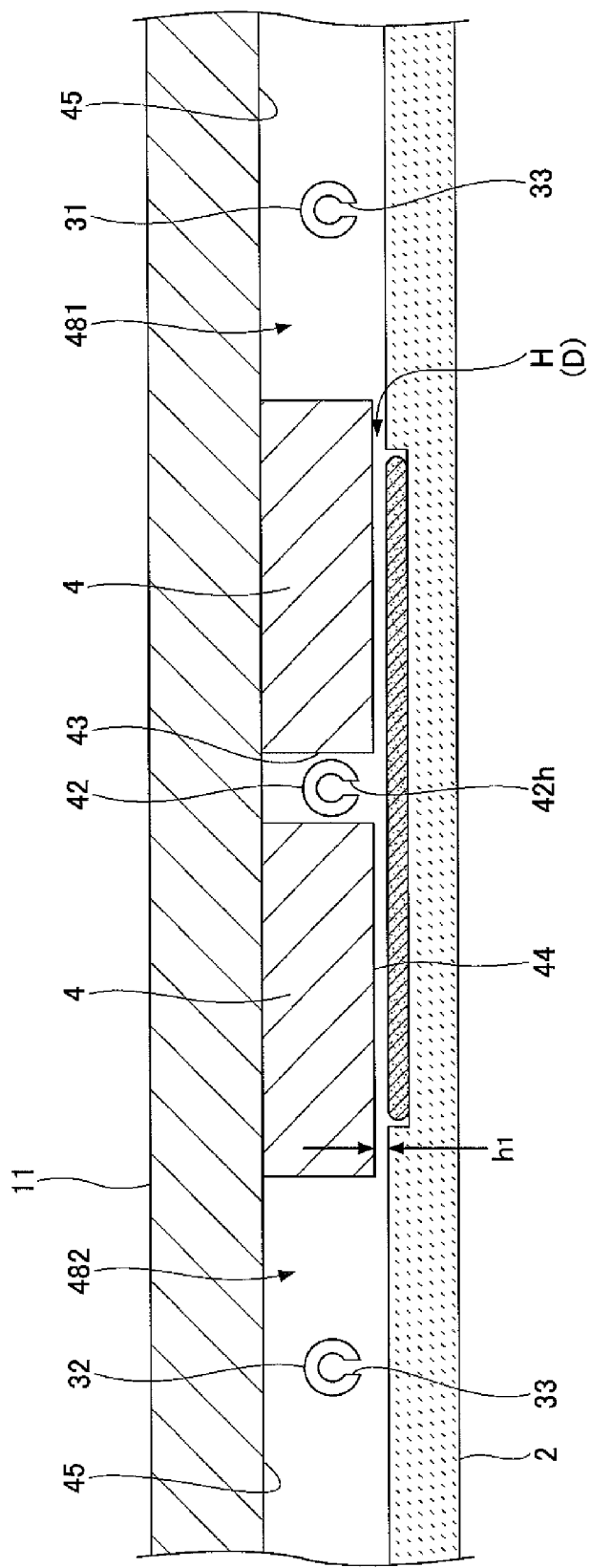
FIG. 4 is a partial cross-sectional view of an example of the film deposition apparatus shown in FIG. 1.

FIG. 4 shows a cross-section of the vacuum chamber 1 along a concentric circle of the susceptor 2 from the reaction gas nozzle 31 to the reaction gas nozzle 32. As shown in FIG. 4, the protruding portion 4 is fixed to the lower surface of the ceiling plate 11. Thus, there are provided a flat low ceiling surface 44 (first ceiling surface) formed as the lower surface of the protruding portion 4 and flat higher ceiling surfaces 45 (second ceiling surface) which are higher than the low ceiling surface 44 and formed at outboard sides of the low ceiling surface 44 in the circumferential direction. The low ceiling surface 44 has substantially a sector top view shape where the apex is removed in an arc shape.

Further, as shown in the drawings, the protruding portion 4 is provided with a groove portion 43 at a center in the circumferential direction. The groove portion 43 is formed to extend in the radius direction of the susceptor 2. The separation gas nozzle 42 is positioned within the groove portion 43. Although not shown in FIG. 4, the separation gas nozzle 41 is also positioned within a groove portion 43 provided in the other protruding portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, for an explanatory purpose, a space below the high ceiling surface 45 where the reaction gas nozzle 31 is provided is referred to as "481" and a space below the high ceiling surface 45 where the reaction gas nozzle 32 is provided is referred to as "482" as shown in FIG. 4.

The separation gas nozzle 42 (and similarly for the separation gas nozzle 41) is provided with plural gas discharge holes 42h formed along the longitudinal direction of the separation gas nozzle 42 with a predetermined interval (10 mm, for example).

The low ceiling surface 44 provides a separation space H (separation area D), which is a small space, with respect to the susceptor 2. When the $N_2$ gas is provided from the separation gas nozzle 42, the $N_2$ gas flows toward the space 481 and the space 482 through the separation space H. At this time, as the volume of the separation space H is smaller than those of the spaces 481 and 482, the pressure in the separation space H can be made higher than those in the spaces 481 and 482 by the $N_2$ gas. It means that between the spaces 481 and 482, the separation space H provides a pressure barrier.

Further, the $N_2$ gas flowing from the separation space H toward the spaces 481 and 482 functions as a counter flow against the Si containing gas from the gas first process area P1 and the oxidation gas from the second process area P2. Thus, the Si containing gas from the first process area P1 and the oxidation gas from the second process area P2 are separated by the separation space H. Therefore, mixing and reacting of the Si containing gas with the oxidation gas are prevented in the vacuum chamber 1.

The height h1 of the low ceiling surface 44 above an upper surface of the susceptor 2 may be appropriately determined based on the pressure of the vacuum chamber 1 at a film deposition time, the rotational speed of the susceptor 2, and a supplying amount of the separation gas ($N_2$ gas) in order to maintain the pressure in the separation space H higher than those in the spaces 481 and 482.

The ceiling plate 11 is further provided with the inner protruding portion 5 at its lower surface to surround the outer periphery of the core unit 21 which fixes the susceptor 2. The inner protruding portion 5 is continuously formed with the inner portions of the protruding portions 4 and has a lower surface which is formed at the same height as those of the low ceiling surfaces 44, in this embodiment.

Figure 5:
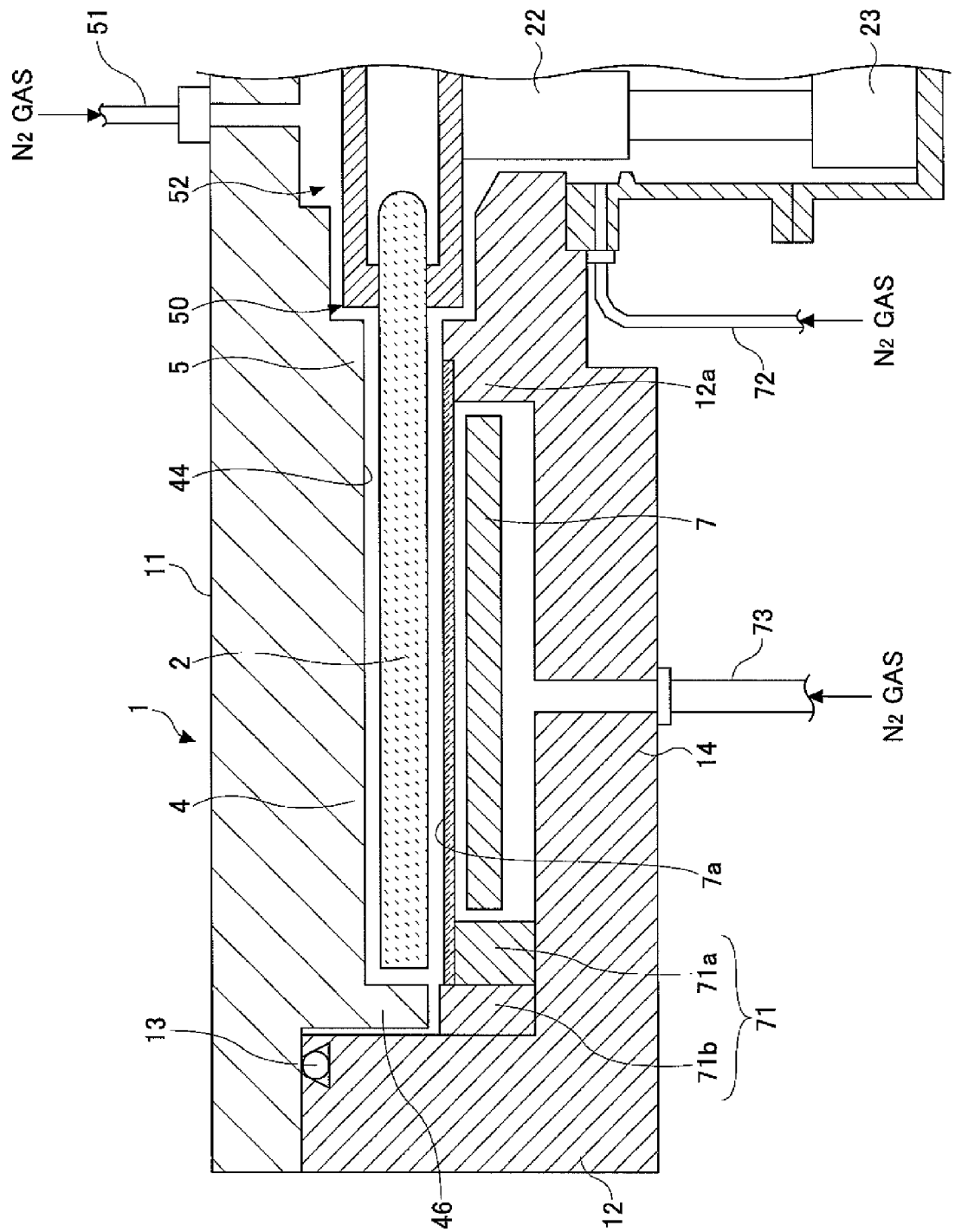
FIG. 5 is a partial cross-sectional view of an example of the film deposition apparatus shown in FIG. 1

FIG. 1 is a cross-sectional view taken along an I-I' line in FIG. 3, and showing an area where the ceiling surface 45 is provided. FIG. 5 is a partial cross-sectional view showing an area where the ceiling surface 44 is provided.

As shown in FIG. 5, the protruding portion 4 having a substantially sector top view shape is provided with an outer bending portion 46 at its outer peripheral end portion (at an outer peripheral end portion side of the vacuum chamber 1) which is bent to have an L-shape to face an outer end surface of the susceptor 2. The outer bending portion 46, similar to the protruding portions 4, suppresses a flow of reaction gasses from both sides of the separation areas D to prevent mixing of the reaction gasses. As the protruding portions 4 are provided on the ceiling plate 11 which is detachably attached to the chamber body 12. Thus, there is a slight space between the outer periphery surface of the outer bending portion 46 and the chamber body 12. The space between the inner periphery surface of the outer bending portion 46 and an outer surface of the susceptor 2, and the space between the outer periphery surface of the outer bending portion 46 and the chamber body 12 may be a size same as the height h1 (see FIG. 4) of the low ceiling surface 44 with respect to the upper surface of the susceptor 2, for example.

The inside perimeter wall of the chamber body 12 is provided to extend in a vertical direction to be closer to the outer peripheral surface of the outer bending portion 46 at the separation area D. However, other than the separation area D, as shown in FIG. 1, for example, the inside perimeter wall of the chamber body 12 is formed to have a concave portion outside of a portion facing the outer end surface of the susceptor 2 toward the bottom portion 14. Hereinafter, for an explanatory purpose, the concave portion, having a substantially rectangular cross-sectional view, is referred to as an "evacuation area".

Specifically, a part of the evacuation area which is in communication with the first process area P1 is referred to as a first evacuation area E1, and a part of the evacuation area which is in communication with the second process area P2 is referred to as a second evacuation area E2. As shown in FIG. 1 to FIG. 3, a first evacuation port 610 and a second evacuation port 620 are respectively provided at the bottom portions of the first evacuation area E1 and the second evacuation area E2. In this embodiment, the evacuation areas are provided to be positioned outside the outer periphery of the susceptor 2. It means that the first evacuation port 610 and the second evacuation port 620 are provided to be positioned outside the outer periphery of the susceptor 2.

The first evacuation port 610 and the second evacuation port 620 are connected to vacuum pumps 640, which are vacuum evacuation units, via evacuation pipes 630, respectively, as shown in FIG. 1. The reference numeral 650 is a pressure regulator in FIG. 1.

The heater unit 7 is provided at a space between the susceptor 2 and the bottom portion 14 of the vacuum chamber 1 as shown in FIG. 1 and FIG. 5. The wafers W mounted on the susceptor 2 are heated by the heater unit 7 via the susceptor 2 to a temperature (450° C., for example) determined by a process recipe. A ring cover member 71 is provided at a lower portion side of the outer periphery of the susceptor 2 in order to prevent gasses from being introduced into the space below the susceptor 2 by partitioning atmosphere from a space above the susceptor 2 to the evacuation areas E1 and E2 and atmosphere in which the heater unit 7 is positioned.

As shown in FIG. 5, the cover member 71 includes an inner member 71a which is provided to face the outer edge portion and the further outer portion of the susceptor 2 from a lower side, and an outer member 71b which is provided between the inner member 71a and an inner wall surface of the chamber body 12. The outer member 71b is provided to face the outer bending portion 46, which is formed at an outer edge portion at lower side of each of the protruding portions 4 in the separation areas D. The inner member 71a is provided to surround the entirety of the heater unit 7 below the outer end portion (and at a slightly outer side of the outer end portion) of the susceptor 2.

The bottom portion 14 of the vacuum chamber 1 closer to the rotation center than the space where the heater unit 7 is positioned protrudes upward to be close to the core unit 21 to form a protruded portion 12a. There is provided a small space between the protruded portion 12a and the core unit 21. Further, there is provided a small space between an inner peripheral surface of the bottom portion 14 and the rotary shaft 22 to be in communication with the case body 20. A purge gas supplying pipe 72 which supplies $N_2$ gas as the purge gas to the small space for purging is provided in the case body 20. The bottom portion 14 of the vacuum chamber 1 is provided with plural purge gas supplying pipes 73 (only one of the purge gas supplying pipes 73 is shown in FIG. 5) which are provided with a predetermined angle interval in the circumferential direction below the heater unit 7 for purging the space where the heater unit 7 is provided. Further, a cover member 7a is provided between the heater unit 7 and the susceptor 2 to prevent the gas from being introduced into the space where the heater unit 7 is provided. The cover member 7a is provided to extend from an inner peripheral wall (upper surface of the inner member 71a) of the outer member 71b to an upper end portion of the protruded portion 12a in the circumferential direction. The cover member 7a may be made of quartz, for example.

The film deposition apparatus further includes a separation gas supplying pipe 51 which is connected to a center portion of the ceiling plate 11 of the vacuum chamber 1 and provided to supply $N_2$ gas as the separation gas to a space 52 between the ceiling plate 11 and the core unit 21. The separation gas supplied to the space 52 flows through a small space between the inner protruding portion 5 and the susceptor 2 to flow along a front surface of the susceptor 2 where the wafers W are to be mounted to be discharged from an outer periphery. A space 50 is kept at a pressure higher those of the space 481 and the space 482 by the separation gas. Thus, the mixing of the Si containing gas supplied to the first process area P1 and the oxidation gas supplied to the second process area P2 by flowing through the center area C can be prevented by the space 50. It means that the space 50 (or the center area C) can function similarly as the separation space H (or the separation area D).

Further, as shown in FIG. 2 and FIG. 3, a transfer port 15 is provided at a side wall of the vacuum chamber 1 for allowing the wafers W, which are substrates, to pass between an external transfer arm 10 and the susceptor 2. The transfer port 15 is opened and closed by a gate valve (not shown in the drawings). Further, lift pins, which penetrate the concave portion 24 to lift up the respective wafer W from a backside surface, and a lifting mechanism for the lift pins (both are not shown in the drawings) are provided at a respective portion below the susceptor 2. Thus, the respective wafer W is passed between the external transfer arm 10 and the concave portion 24 of the susceptor 2, which is a mounting portion, at a place facing the transfer port 15.

Figure 6:
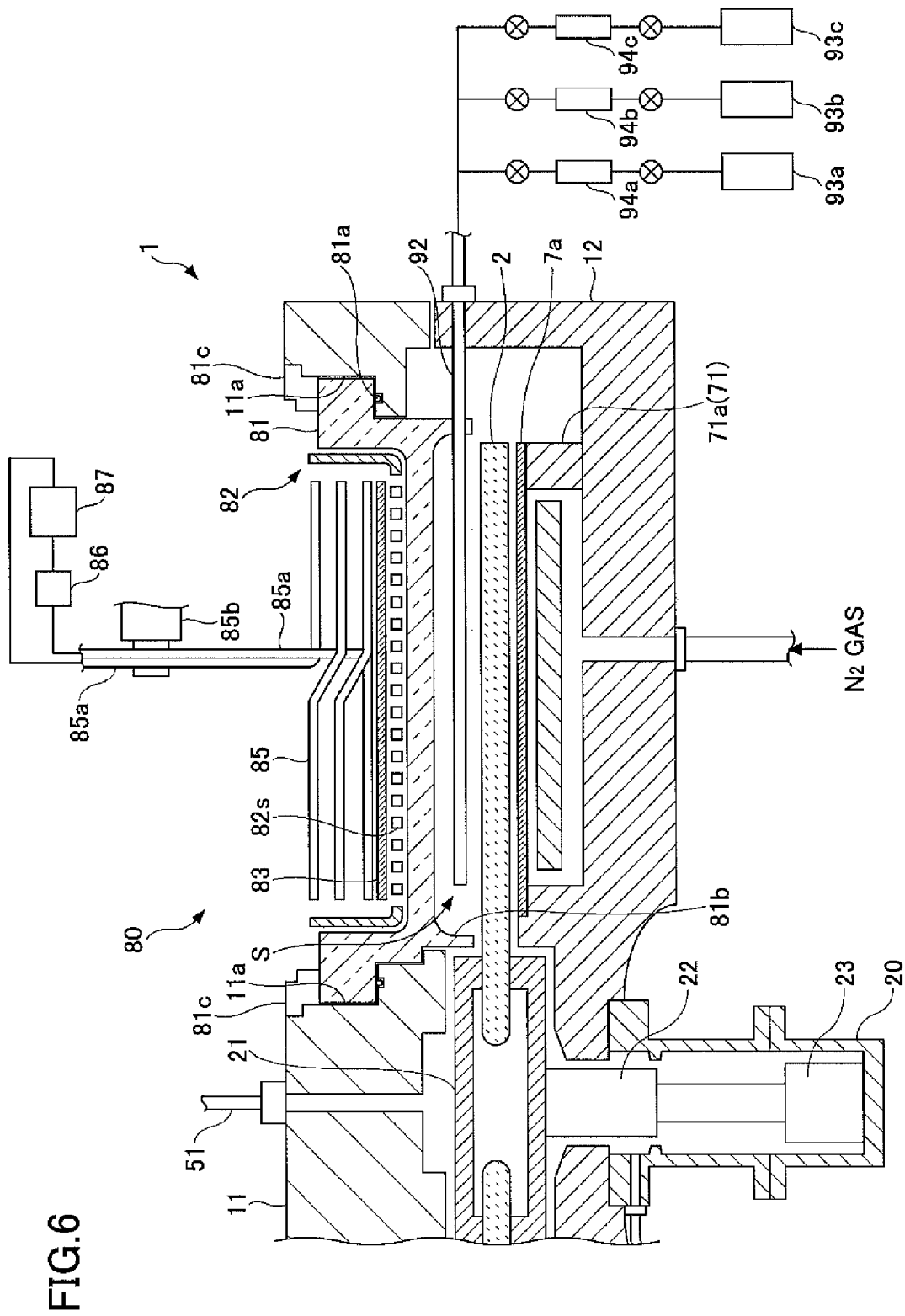
FIG. 6 is a schematic cross-sectional view of an example of a plasma generating device provided in the film deposition apparatus shown in FIG. 1.
Figure 7:
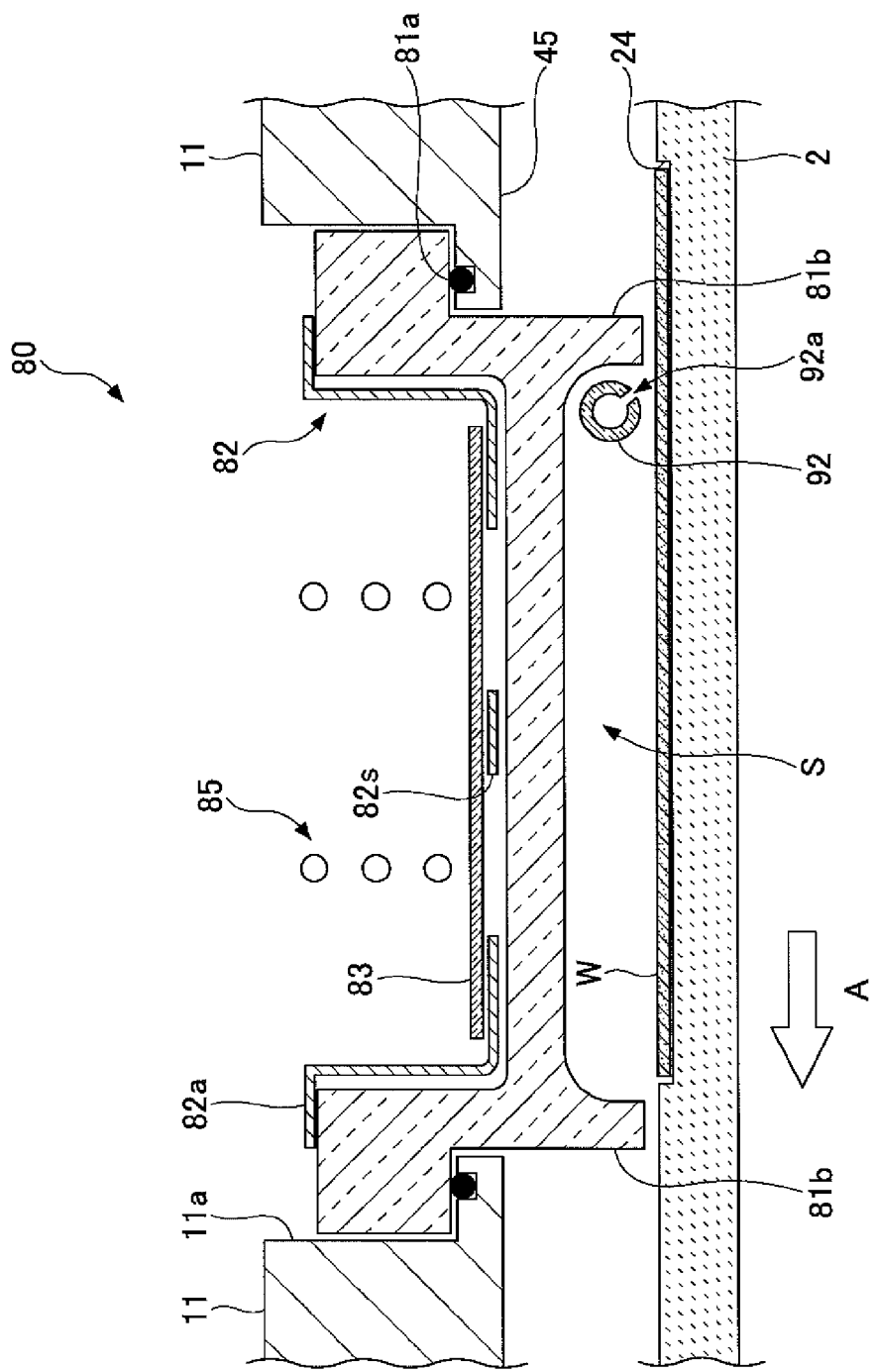
FIG. 7 is another schematic cross-sectional view of the plasma generating device provided to the film deposition apparatus shown in FIG. 1.
Figure 8:
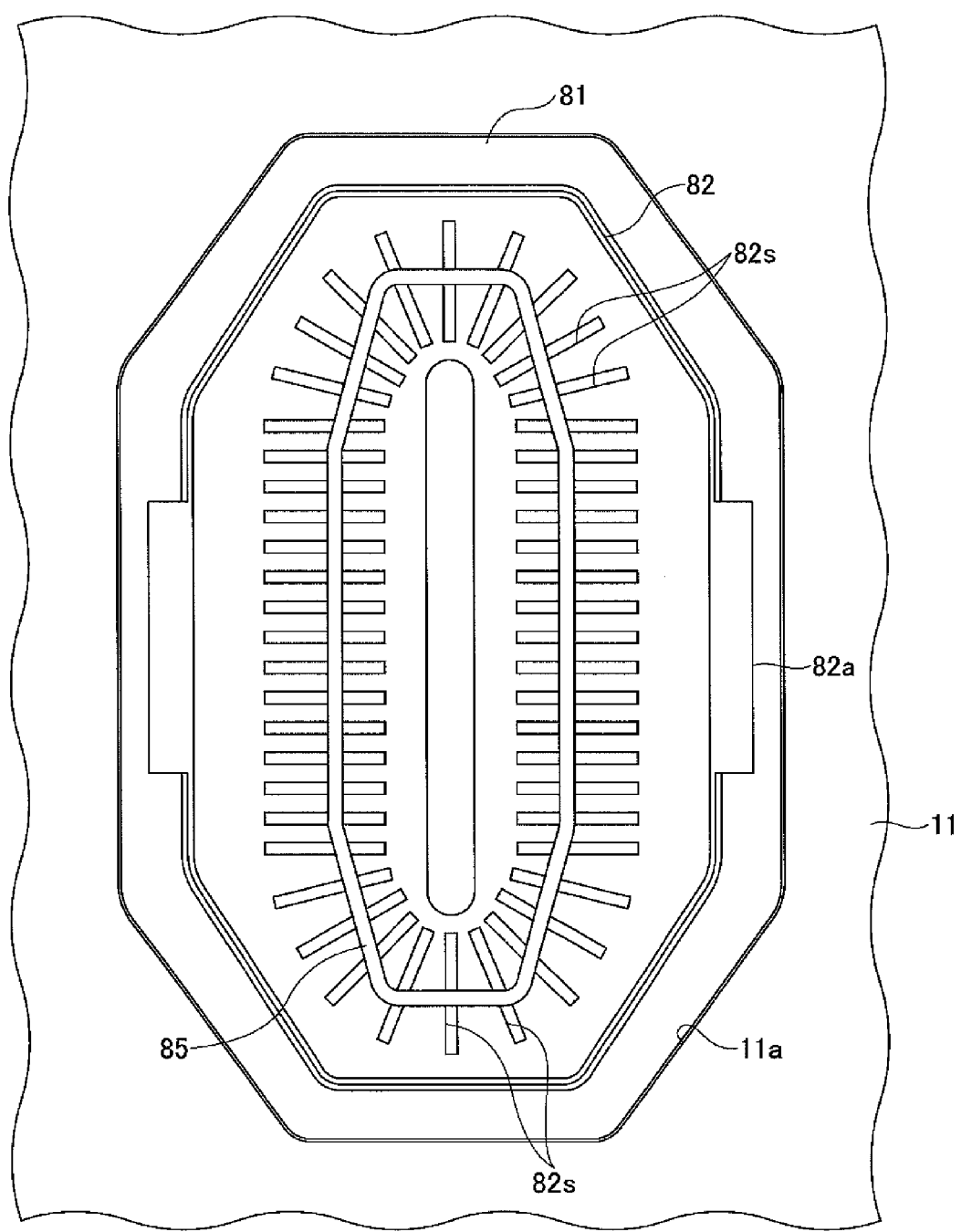
FIG. 8 is a schematic top view of the plasma generating device provided to the film deposition apparatus shown in FIG. 1.

Next, the plasma generating device 80 is explained with reference to FIG. 6 to FIG. 8. FIG. 6 is a schematic cross-sectional view of the plasma generating device 80 taken along the radius direction of the susceptor 2. FIG. 7 is a schematic cross-sectional view of the plasma generating device 80 taken along a direction perpendicular to the radius direction of the susceptor 2. FIG. 8 is a schematic top view showing the plasma generating device 80. For an explanatory purpose, parts of the components are not shown in the drawings.

Referring to FIG. 6, the plasma generating device 80 is made of a material which is permeable to high frequency waves, and is provided with a concave portion in its upper surface. The plasma generating device 80 further includes a frame member 81 which is embedded in an open portion 11a provided in the ceiling plate 11, a Faraday shield plate 82 housed in the concave portion of the frame member 81 and has substantially a box shape whose top is opened, an insulating plate 83 placed on a bottom surface of the Faraday shield plate 82, and a coil antenna 85 supported above the insulating plate 83. The antenna 85 has substantially an octagonal upper plane shape.

The open portion 11a of the ceiling plate 11 is formed to have plural step portions, and one of the step portions is provided with a groove portion to extend along the perimeter where a sealing member 81a such as an O-ring or the like is embedded. The frame member 81 is formed to have plural step portions which correspond to the step portions of the open portion 11a, and when the frame member 81 is engaged in the open portion 11a, a back side surface of one of the step portions contacts the sealing member 81a embedded in the open portion 11a so that the ceiling plate 11 and the frame member 81 are kept in an air-tight manner.

Further, as shown in FIG. 6, a pushing member 81c, which extends along the outer peripheral of the frame member 8 which is embedded in the open portion 11a of the ceiling plate 11, is provided so that the frame member 81 is pushed downward with respect to the ceiling plate 11. With this, the ceiling plate 11 and the frame member 81 are further kept in an air-tight manner.

The lower surface of the frame member 81 is positioned to face the susceptor 2 in the vacuum chamber 1 and a projection portion 81b which projects downward (toward the susceptor 2) is provided at the perimeter at the lower surface. The lower surface of the projection portion 81b is close to the surface of the susceptor 2 and a space (hereinafter referred to as an inner space S) is provided by the projection portion 81b, the surface of the susceptor 2 and the lower surface of the frame member 81 above the susceptor 2. The space between the lower surface of the projection portion 81b and the surface of the susceptor 2 may be the same as the height h1 between the ceiling surface 44 with respect to the upper surface of the susceptor 2 in the separation space H (FIG. 4).

Further, a gas introduction nozzle 92 which penetrates the projection portion 81b is provided in the inner space S. In this embodiment, as shown in FIG. 6, an argon gas supplying source 93a filled with argon (Ar) gas, an oxygen gas supplying source 93b filled with oxygen ($O_2$) gas and an ammonia gas supplying source 93c filled with ammonia ($NH_3$) gas are connected to the gas introduction nozzle 92.

The gas introduction nozzle 92 is provided with plural gas discharge holes 92a formed along the longitudinal direction thereof with a predetermined interval (10 mm, for example) so that the Ar gas and the like are discharged from the gas discharge holes 92a.

As shown in FIG. 7, the gas discharge holes 92a are provided to be inclined from a vertical direction with respect to the susceptor 2 toward the upstream rotation direction of the susceptor 2. Thus, the gas supplied from the gas introduction nozzle 92 is discharged in a direction opposite to the rotation direction of the susceptor 2, specifically, toward a space between a lower surface of the projection portion 81b and the surface of the susceptor 2. With this, the flows of the reaction gas and the separation gas from a space below the ceiling surface 45 which is upstream of the plasma generating device 80 toward the inner space S along the rotation direction of the susceptor 2 can be prevented. Further, as described above, as the projection portion 81b which is formed along an outer periphery of the lower surface of the frame member 81 is close to the surface of the susceptor 2, the pressure in the inner space S can be kept high by the gas from the gas introduction nozzle 92. With this as well, the flows of the reaction gas and the separation gas toward the inner space S can be prevented.

The Faraday shield plate 82 is made of a conductive material such as a metal and is grounded, although not shown in the drawings. As clearly shown in FIG. 8, the Faraday shield plate 82 is provided with plural slits 82s at its bottom portion. Each of the slits 82s are extending to be in substantially perpendicular relationship with the corresponding lines of the antenna 85 which has the substantially octagonal plane shape.

As shown in FIG. 7 and FIG. 8, the Faraday shield plate 82 includes two support portions 82a which are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 and the antenna 85 while passing the high frequency wave radiated from the antenna 85.

The antenna 85 is formed by winding a pipe made of copper three times, for example, in a substantially octagonal plane shape. With this structure, cooling water can be circulated in the pipe and the antenna 85 is prevented from being heated to a high temperature by the high frequency wave provided to the antenna 85. The antenna 85 is provided with a standing portion 85a to which a support portion 85b is attached. The antenna 85 is maintained at a predetermined position in the Faraday shield plate 82 by the support portion 85b. The high frequency power source 87 is connected to the support portion 85b via the matching box 86. The high frequency power source 87 is capable of generating high frequency waves of 13.56 MHz, for example.

According to the plasma generating device 80 thus structured, when the high frequency waves are supplied to the antenna 85 from the high frequency power source 87 via the matching box 86, the electromagnetic field is generated by the antenna 85. In the electromagnetic field, the electric field component is shielded by the Faraday shield plate 82 so is not transmitted downward. On the other hand, the magnetic field component is transmitted within the inner space S via the plural slits 82s of the Faraday shield plate 82. Plasma is generated by the gasses such as the Ar gas, the $O_2$ gas, the $NH_3$ gas and the like which are supplied to the inner space S with a predetermined flow rate ratio (mixed ratio) from the gas introduction nozzle 92 by the magnetic field component. By such plasma, damage to a thin film formed on a wafer W, or to the components in the vacuum chamber 1 can be reduced.

As shown in FIG. 1, the film deposition apparatus of the embodiment further includes a control unit 100 which controls the entirety of the film deposition apparatus and a storing unit 101. The control unit 100 may be a computer. The storing unit 101 stores a program by which the film deposition apparatus executes the film deposition method (as will be explained later) under a control of the control unit 100. The program is formed to include steps capable of executing the film deposition method. The storing unit 101 may be a hard disk or the like, for example. The program stored in the storing unit 101 may be previously stored in a recording medium 102 such as a compact disk (CD), a magneto-optic disk, a memory card, a flexible disk, or the like and may be installed in the storing unit 101 using a predetermined reading device.

(Particle Reducing Method)

Figure 9:
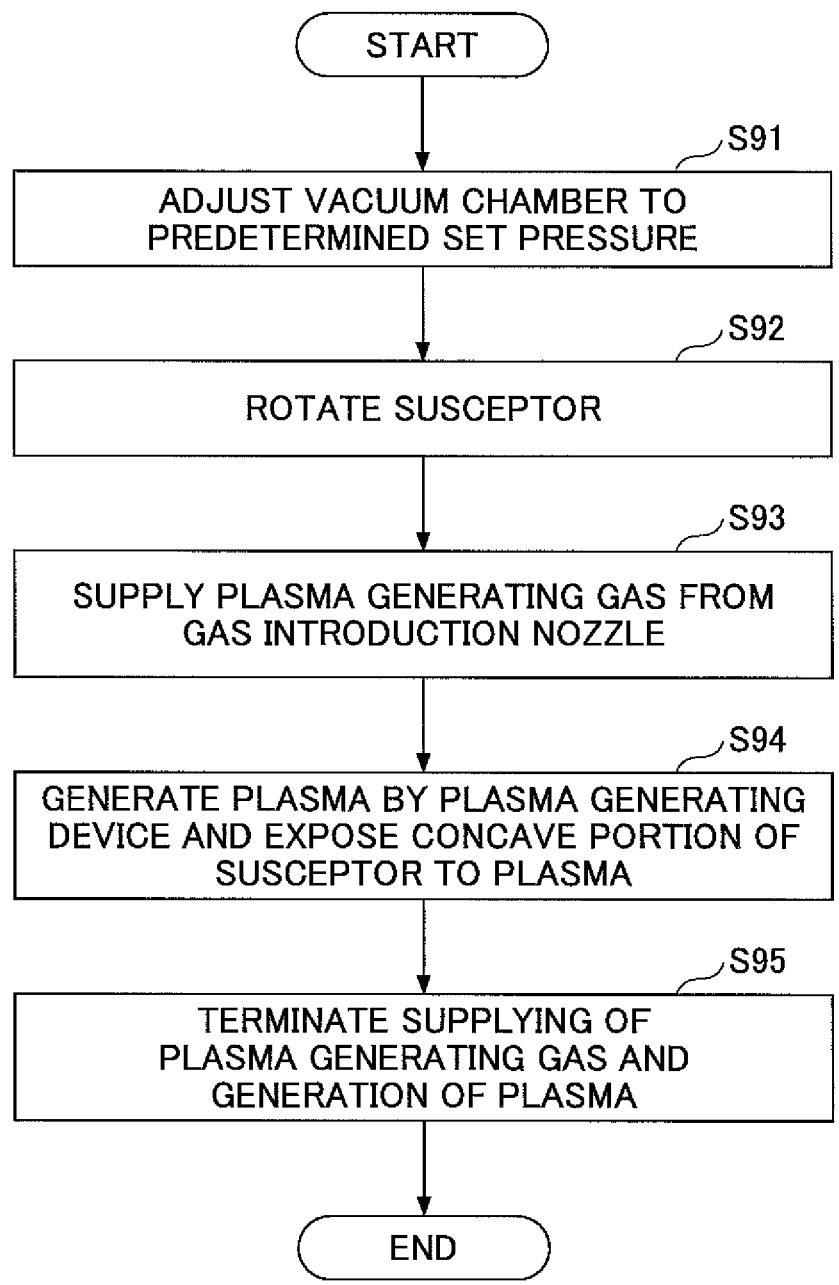
FIG. 9 is a flowchart showing an example of a particle reducing method of the embodiment.
Figure 10:
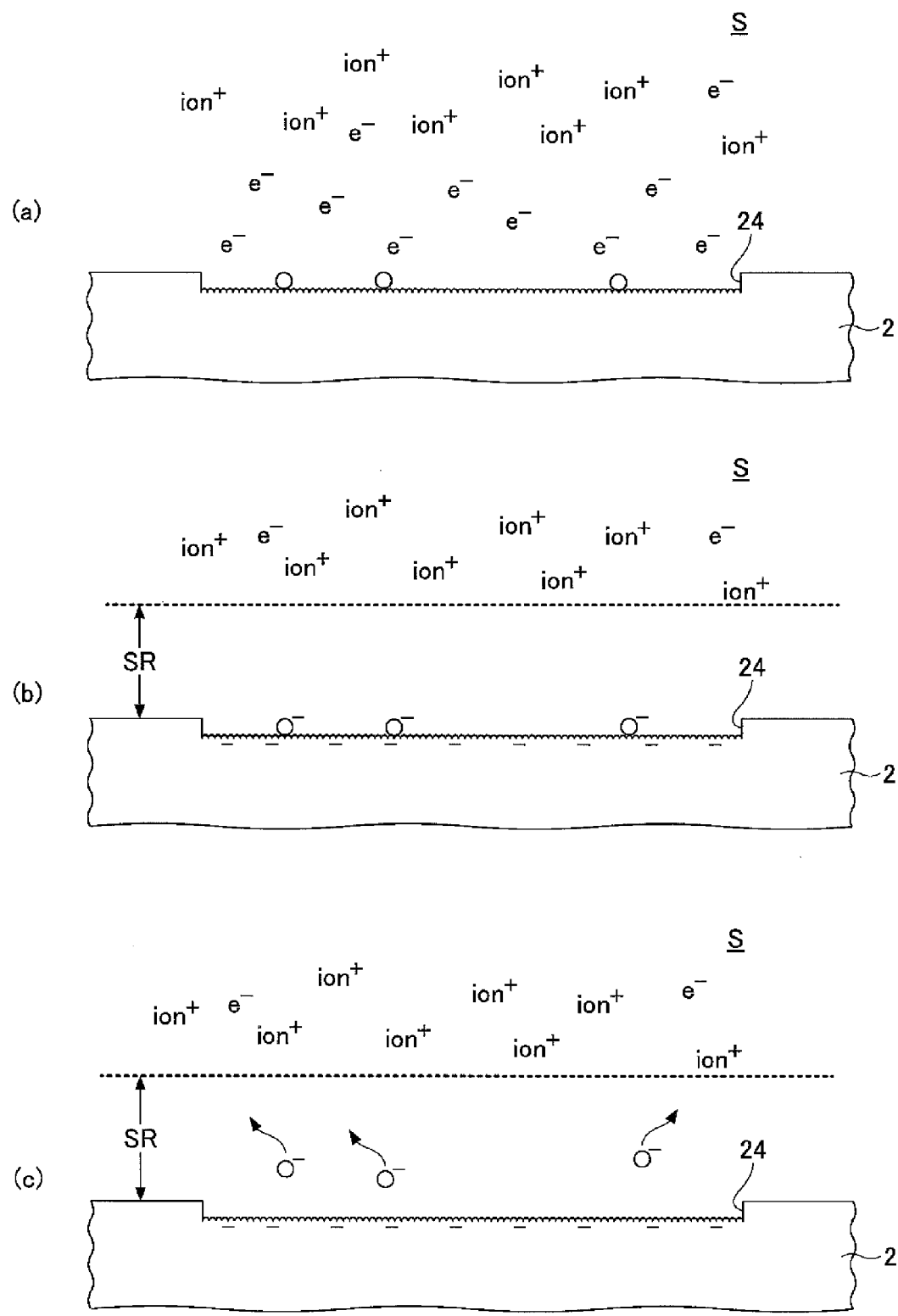
FIG. 10 is a schematic view showing a susceptor (substrate mounting portion) which is charged by the plasma generating device of the film deposition apparatus shown in FIG. 1.

With reference to FIG. 9 and FIG. 10, the particle reducing method of the embodiment in which the above described film deposition apparatus is used, is explained.

Further, in this embodiment, the following operations are performed when the film deposition process on all the wafers W of a single lot is completed, and wafers W are not mounted on the susceptor 2. Further, it is assumed that the transfer port 15 (FIG. 2 and FIG. 3) is closed by a gate valve, not shown in the drawings.

First, in step S91 (FIG. 9), the vacuum chamber 1 is adjusted to be a predetermined set pressure. Specifically, the vacuum chamber 1 is evacuated by the vacuum pump 640 to the minimum vacuum level, and then, the $N_2$ gas (second gas) as the separation gas is discharged from the separation gas nozzles 41 and 42 at a predetermined flow rate. At this time, the $N_2$ gas is also discharged from the separation gas supplying pipe 51 and the purge gas supplying pipes 72 and 73 at a predetermined flow rate, respectively. With this, the vacuum chamber 1 is adjusted to a predetermined set pressure by the pressure regulator 650. Then, in step S92, the susceptor 2 is rotated at a predetermined rotational speed.

Subsequently, in step S93, the Ar gas as the plasma generating gas (first gas) is supplied to the inner space S at a predetermined flow rate from the argon gas supplying source 93a via the gas introduction nozzle 92. Further, in step S94, high frequency waves with an output power of 700 W, for example, are provided to the antenna 85 of the plasma generating device 80 from the high frequency power source 87. With this, the plasma is generated in the inner space S.

By the rotation of the susceptor 2, when one of the concave portions 24 of the susceptor 2 reaches a lower area of the plasma generating device 80, the concave portion 24 is exposed to plasma formed in the inner space S. At this time, as shown in (a) of FIG. 10, the electrons ($e^-$) in the plasma reach the bottom surface of the concave portion 24 (the susceptor 2) faster than positive ions ($ion^+$). Thus, the bottom surface of the concave portion 24 is negatively charged. With this, a sheath area SR is formed above the bottom surface of the concave portion 24 as shown in (b) of FIG. 10.

When the susceptor 2 is further rotated, the concave portion 24 moves away from a lower area of the plasma generating device 80 and the next concave portion 24 reaches the lower area of the plasma generating device 80. Then, similarly, the bottom surface of the respective concave portion 24 is negatively charged.

As such, when the susceptor 2 is rotated once, the bottom surfaces (the susceptor 2) of all of the concave portions 24 are negatively charged when passing through the lower area of the plasma generating device 80. Thereafter, in step S95, the particle reducing method of the embodiment is finished when supplying of the high frequency waves from the high frequency power source 87 is terminated, as well as the supplying of the Ar gas from the gas introduction nozzle 92 is terminated. The susceptor 2 may be rotated twice or more.

As described above, the concave portions 24 are formed by grinding or etching the susceptor made of quartz. Thus, there may be fine scrapes at the bottom surface. When the wafers W are mounted on the respective concave portions 24, and the susceptor 2 is rotated, the wafers W move in the respective concave portions 24 so that the backside surface of each of the wafers rasps with the bottom surface of the respective concave portion. In such a case, the bottom surface of the concave portion 24 is easily grinded compared with the backside surface of the wafer W and has a flat mirror finished surface. As a result, the particles of quartz are generated. When the particles adhere to the bottom surface of each of the concave portions 24, the particles may be scattered when the wafers W are mounted on the concave portions 24 or the wafers are removed from the concave portions 24, respectively, to cause contamination where the particles adhere to the surfaces of the wafers W. Further, if the particles of quartz adhere to the backside surface of the wafer W, the particles may adhere to the surface of another wafer W adjacent to the respective wafer W, for example, in a wafer carrier in which the wafers W are housed. Thus, the other wafer W is also contaminated.

Thus, it is necessary to remove the particles of quartz adhered to the bottom surface of each of the concave portions 24 in order to reduce the contamination of the wafers W. However, as the particles of quartz are generated when the bottom surface of the concave portion 24 rasps with the backside surface of the respective wafer W, the particles of quartz may be adhered to the bottom surfaces of the concave portions 24 by reversed polarities by triboelectric charging. Further, the particles of quartz may be included in the fine rough surface remained on the bottom surface of the concave portion 24. Thus, it is hard to remove the particles of quartz by, for example, a purging gas or the like. Further, the susceptor 2 is provided in the vacuum chamber and the particles are generated when the backside surface of the wafer W and the bottom surface of the respective concave portion 24 of the susceptor 2 rasps with each other, it is hard to remove the particles of by washing the susceptor 2.

However, according to the particle reducing method of the embodiment, by exposing the bottom surfaces of the concave portions 24 (the susceptor 2) to plasma, as shown in (b) of FIG. 10, both the bottom surface of the concave portion 24 and the particles P which adhere to the bottom surface are negatively charged. Thus, as shown in (c) of FIG. 10, a repulsive force is generated between the bottom surface of the concave portion 24 and the particles P so that the particles P are easily removed from the bottom surface of the concave portion 24. The particles P removed from the bottom surface of the concave portion 24 can be evacuated from the inner space S with the Ar gas and further evacuated from the second evacuation port 620 (FIG. 3) with the $N_2$ gas (the separation gas) which flows within the vacuum chamber 1. Thus, as a result, the particles of quartz P at the bottom surface of the concave portion 24 are effectively removed so that the particles generated from the concave portion 24 of the susceptor 2 can be reduced.

In this embodiment, as described above, the $N_2$ gas is discharged from the separation gas supplying pipe 51 and the purge gas supplying pipes 72 and 73 at a predetermined flow rate, respectively. With this, a flow of a gas is generated in which the $N_2$ gas supplied to the separation gas supplying pipe 51 moves toward the second evacuation port 620 along the surface of the concave portions 24 of the susceptor 2. In this embodiment, the processes of step S93 to step S94 in FIG. 9 are performed while such a flow of the gas is generated. Thus, the particles of quartz P of the bottom surface of each of the concave portions 24 can be effectively removed to reduce the particles generated from the concave portions 24 of the susceptor 2.

Further, at this time, the separation gas is also supplied from the separation gas nozzles 41 and 42. Thus, the pressure of the separation space H below the low ceiling surface 44 can be made higher than the pressures at the spaces 481 and 482 to prevent the particles generated at the concave portions 24 of the susceptor 2 from introducing into the separation space H.

Further, according to the particle reducing method of the embodiment, it is not necessary to wash the susceptor 2 after deconstructing the vacuum chamber 1 or the like, the particles can be easily reduced with a short period operation. Further, the particle reducing method of the embodiment may be performed when the wafers W are not mounted on the susceptor 2 such as at a period after all of the wafers W of a single lot are performed with the film deposition process and before the film deposition process for the wafers W of the next lot is started, or when the film deposition apparatus is at an idle state, for example, the throughput of the film deposition apparatus is not lowered.

Here, when the plasma is generated by the Ar gas, quartz is not decomposed (or etched) by the plasma. Further, even if a silicon oxide film is deposited on a part of the susceptor 2 other than the concave portions 24, the silicon oxide film is not decomposed or the like by the plasma of the Ar gas. Thus, it can be considered as follows. The effect of the particle reducing method of the embodiment is not a result of removing the silicon oxide film deposited on the susceptor 2, but, as described above, a result that the particles which adhere to the bottom surface of each of the concave portions 24 are negatively charged, which is the same as the respective bottom surface.

The particle reducing method explained above with reference to FIG. 9 and FIG. 10 can be performed at a predetermined timing before or after a film deposition step in which the wafers W are mounted on the susceptor 2 and films are deposited on the wafers W.

Figure 11:
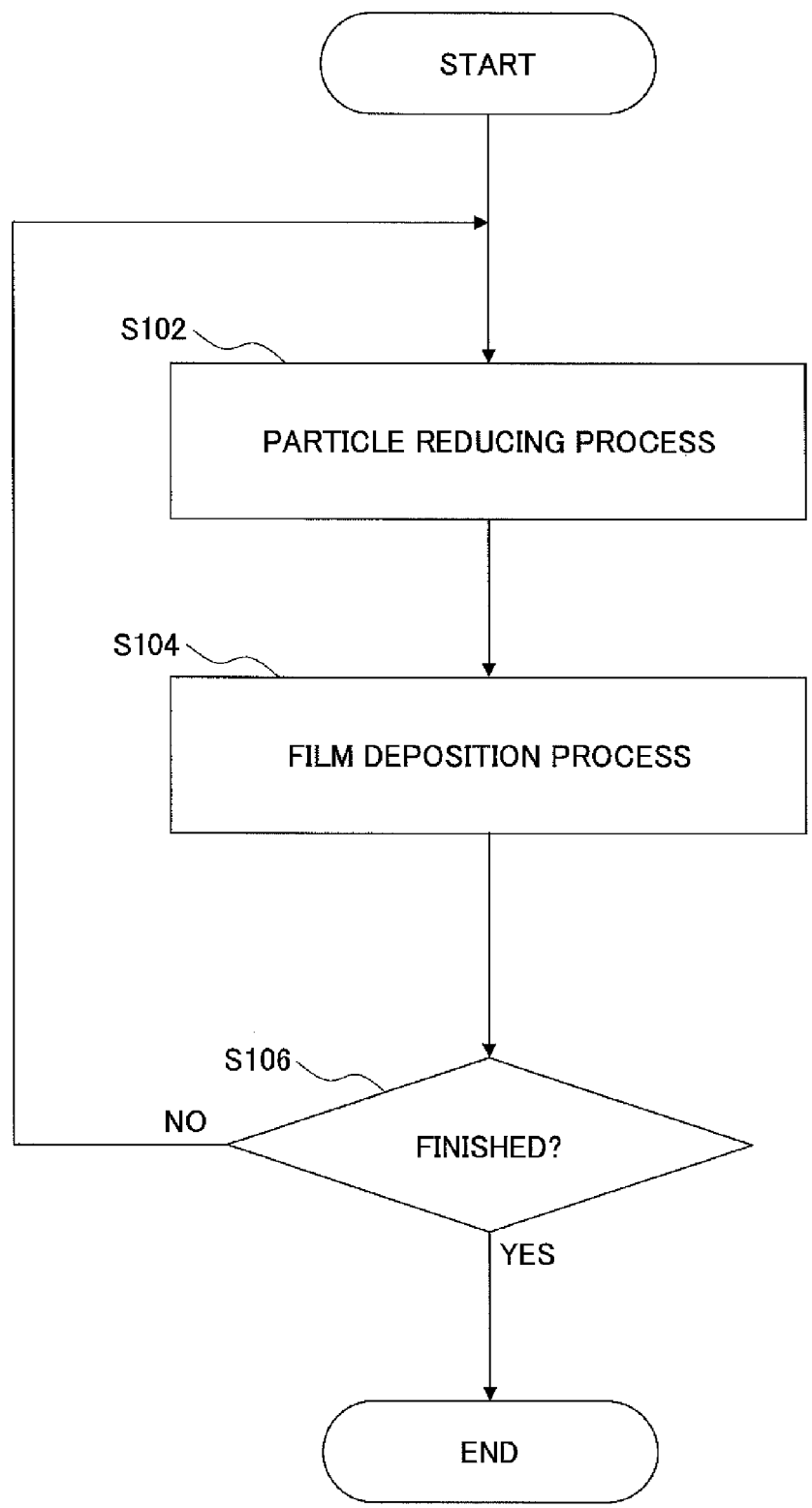
FIG. 11 is a flowchart showing an example of a film deposition method of the embodiment.

FIG. 11 is a flow chart showing an example of the film deposition process of the embodiment. Here, first, the particle reducing method (hereinafter, referred to as a "particle reducing process") explained above with reference to FIG. 9 is performed (step S102). When the particle reducing process is finished, the wafers W are mounted on the susceptor 2 and the film deposition process is performed (step S104). Thereafter, whether the film deposition process is continued in the film deposition apparatus is determined (step S106). Then, when the film deposition process is not finished (NO of step S106), the particle reducing process is performed again (step S102). On the other hand, when the film deposition process is finished (YES of step S106), the process is ended.

Here, it is not necessary to perform the particle reducing process every time a cycle of the film deposition process is performed, and the particle reducing process may be performed after plural cycles of the film deposition process are performed. Further, even for a case where it is determined that the film deposition process is not performed in step S106, the particle reducing process may be performed before the process is finished. Further, the particle reducing process may be performed at a necessary timing between the film deposition processes by determining the generation status of the particles in accordance with the film deposition status of the deposited film, or by monitoring with a sensor or the like.

The present invention is not limited to the specifically disclosed embodiments, and variations and modifications may be made without departing from the scope of the present invention.

For example, as long as it is possible to charge the bottom surface of each of the concave portions 24 (and the particles adhere onto the respective bottom surface) of the susceptor 2 by generated plasma, other gasses may be used instead of the Ar gas. At this time, a gas which is inactive against the susceptor 2 may be used.

Prior to step S91, a step of confirming that the wafers W are not mounted on the susceptor 2 may be performed. This confirmation may be performed by a wafer position detection apparatus provided to the vacuum chamber 1, for example. Alternatively, this confirmation may be performed by the above described operation by which the wafer W to be mounted on the concave portion 24 is passed to the transfer arm 10 (FIG. 3) using the lift pins. Specifically, one of the concave portions 24 is positioned to face the transfer port 15 (FIG. 3) by rotating the susceptor 2, and then, the lift pins are moved to penetrate the through holes to be protruded to the upper area of the susceptor 2. Then, the transfer arm 10 (FIG. 3) is inserted into the vacuum chamber 1 via the transfer port 15 and the lift pins are moved downward. When the wafer W is not mounted on the concave portion 24, the transfer arm 10 cannot receive a wafer W. This fact may be detected by a sensor provided to the transfer arm 10, for example. With this, a fact that the wafer W is not mounted on the concave portion 24 can be detected. This operation can be performed for all of the concave portions 24.

Further, although the particle reducing method is performed for the film deposition apparatus including the susceptor 2 made of quartz is exemplified, the susceptor 2 is not limited to that made of quartz, and may be made of an insulating object such as carbon, silicon carbide (SiC) or the like. Further a susceptor 2 made of carbon and the surface of which is coated with SiC may be used. When the susceptor 2 made of such an insulating object is exposed to the plasma, the surface is negatively charged so that the similar advantage as explained above can be obtained.

In the above embodiment, although the plasma generating device 80 is exemplified to adopt a so-called "inductive coupling plasma (ICP) source" including the antenna 85, the plasma generating device 80 may adopt a capacitively coupled plasma (CCP) source.

According to the embodiment, a particle reducing method capable of reducing particles generated by a susceptor on which a substrate is to be mounted is provided.

Although a preferred embodiment of the particle reducing method and the film deposition method has been specifically illustrated and described, it is to be understood that minor modifications may be made therein without departing from the spirit and scope of the invention as defined by the claims.

What is claimed is:

1. A particle reducing method comprising:
   a step of supplying a first gas to a vacuum chamber in which a susceptor, formed by an insulating object and a surface of which is provided with a plurality of circular concave portions, is rotatably provided;
   a step of generating plasma from the first gas by supplying high frequency waves to a plasma generating device provided for the vacuum chamber; and
   a step of exposing the plurality of circular concave portions, on each of which a substrate is not mounted, to the plasma while rotating the susceptor.

2. The particle reducing method according to claim 1, wherein the susceptor is made of quartz.

3. The particle reducing method according to claim 1, wherein the first gas is inactive against the insulating object.

4. The particle reducing method according to claim 1, wherein the first gas includes argon gas.

5. The particle reducing method according to claim 4, wherein the first gas includes an oxygen gas and a hydrogen containing gas.

6. The particle reducing method according to claim 1, wherein the plasma generating device is inductive coupling plasma.

7. The particle reducing method according to claim 1, further comprising:
   a step of confirming whether a substrate is mounted on each of the plurality of circular concave portions of the susceptor,
   wherein the step of supplying the first gas, the step of generating the plasma, and the step of exposing the plurality of circular concave portions to the plasma are performed when it is determined that the substrate is not mounted on each of the plurality of circular concave portions of the susceptor.

8. The particle reducing method according to claim 1,
wherein the plurality of circular concave portions are provided along a circumferential direction of the susceptor at the surface of the susceptor,
the vacuum chamber includes an evacuation port which is provided outside of an outer periphery of the susceptor and a gas supplying pipe which supplies a gas from a center portion of the susceptor,
the method further comprising:
a step of generating a flow of a second gas toward the evacuation port along a surface of the plurality of circular concave portions of the susceptor by supplying the second gas from the gas supplying pipe,
wherein the step of supplying the first gas, the step of generating the plasma, and the step of exposing the plurality of circular concave portions to the plasma are performed while the flow of the second gas is generated in the step of generating the flow of the second gas.

\* \* \* \* \*